US008501614B1

(12) United States Patent
Shih et al.

(10) Patent No.: US 8,501,614 B1
(45) Date of Patent: Aug. 6, 2013

(54) METHOD FOR MANUFACTURING FINE-PITCH BUMPS AND STRUCTURE THEREOF

(75) Inventors: Cheng-Hung Shih, Changhua County (TW); Yung-Wei Hsieh, Hsinchu (TW); Shu-Chen Lin, Pingtung County (TW); Cheng-Fan Lin, Hsinchu County (TW); Hua-An Dai, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/426,810

(22) Filed: Mar. 22, 2012

(51) Int. Cl.
*H01L 21/44* (2006.01)

(52) U.S. Cl.
USPC ........... 438/612; 438/613; 438/614; 257/737; 257/738

(58) Field of Classification Search
USPC .................. 438/612–614; 257/737–738, 770, 257/E23.021
See application file for complete search history.

(56) References Cited

U.S. PATENT DOCUMENTS 5,665,639 A * 9/1997 Seppala et al. ................... 438/15
6,426,281 B1 * 7/2002 Lin et al. ........................ 438/612

* cited by examiner

*Primary Examiner* — Theresa T Doan
(74) *Attorney, Agent, or Firm* — Jackson IPG PLLC

(57) ABSTRACT

A method for manufacturing fine-pitch bumps comprises the steps of providing a silicon substrate; forming a titanium-containing metal layer on the silicon substrate, wherein the titanium-containing metal layer comprises a plurality of first zones and a plurality of second zones; forming a photoresist layer on the titanium-containing metal layer; patterning the photoresist layer to form a plurality of opening slots; forming a plurality of copper bumps at the opening slots, wherein each of the copper bumps comprises a first top surface and a ring surface; heating the photoresist layer to form a plurality of body portions and a plurality of removable portions; etching the photoresist layer; and removing the second zones to enable each of the first zones to form an under bump metallurgy layer having a bearing portion and an extending portion.

7 Claims, 6 Drawing Sheets one# METHOD FOR MANUFACTURING FINE-PITCH BUMPS AND STRUCTURE THEREOF

FIELD OF THE INVENTION

The present invention is generally related to a method for manufacturing fine-pitch bumps, which particularly relates to the method for manufacturing fine-pitch bumps that prevents copper ions from dissociation.

BACKGROUND OF THE INVENTION

In structure of fine-pitch bumps, a short phenomenon is easily occurred from a relatively short gap between two adjacent copper bumps owing to the copper ion dissociated by the copper bump.

SUMMARY

The primary object of the present invention is to provide a method for manufacturing fine-pitch bumps comprising the following steps of providing a silicon substrate having a surface, a plurality of bond pads disposed at the surface and a protective layer disposed at the surface, wherein the protective layer comprises a plurality of openings, and the bond pads are revealed by the openings; forming a titanium-containing metal layer on the silicon substrate, the titanium-containing metal layer comprises a plurality of first zones and a plurality of second zones located outside the first zones, the protective layer and the bond pads are covered with the titanium-containing metal layer; forming a photoresist layer on the titanium-containing metal layer; patterning the photoresist layer to form a plurality of opening slots corresponded to the first zones of the titanium-containing metal layer; forming a plurality of copper bumps at the opening slots, each of the copper bumps comprises a first top surface and a ring surface; heating the photoresist layer to ream the opening slots of the photoresist layer, and the heat process enables the photoresist layer to form a plurality of body portions and a plurality of removable portions; etching the photoresist layer to remove the removable portions and expose the titanium-containing metal layer; forming a plurality of bump protection layers on the titanium-containing metal layer, the first top surface and the ring surface of each of the copper bumps, wherein each of the bump protection layers comprises a metallic coverage portion and a bump coverage portion having a second top surface, the first top surface and the ring surface of each of the copper bumps are covered with the bump coverage portion; forming a plurality of wettable layers on the second top surfaces; removing the body portions of the photoresist layer; eventually, removing the second zones of the titanium-containing metal layer to enable each of the first zones of the titanium-containing metal layer to form an under bump metallurgy layer located under each of the copper bumps, each of the under bump metallurgy layers comprises a bearing portion located under each of the copper bumps and an extending portion protruded to the ring surface of each of the copper bumps, and the extending portion of each of the under bump metallurgy layers is covered with the metallic coverage portion of each of the bump protection layers. The protection of the bump protection layers may lower dissociation of copper ions released from the copper bumps, which improves reliability of the fine-pitch bump structure effectively. Besides, the protection also prevents the copper bumps from collapsing when removing the second zones of the titanium-containing metal layer.

DETAILED DESCRIPTION OF THE INVENTION

Figure 1:
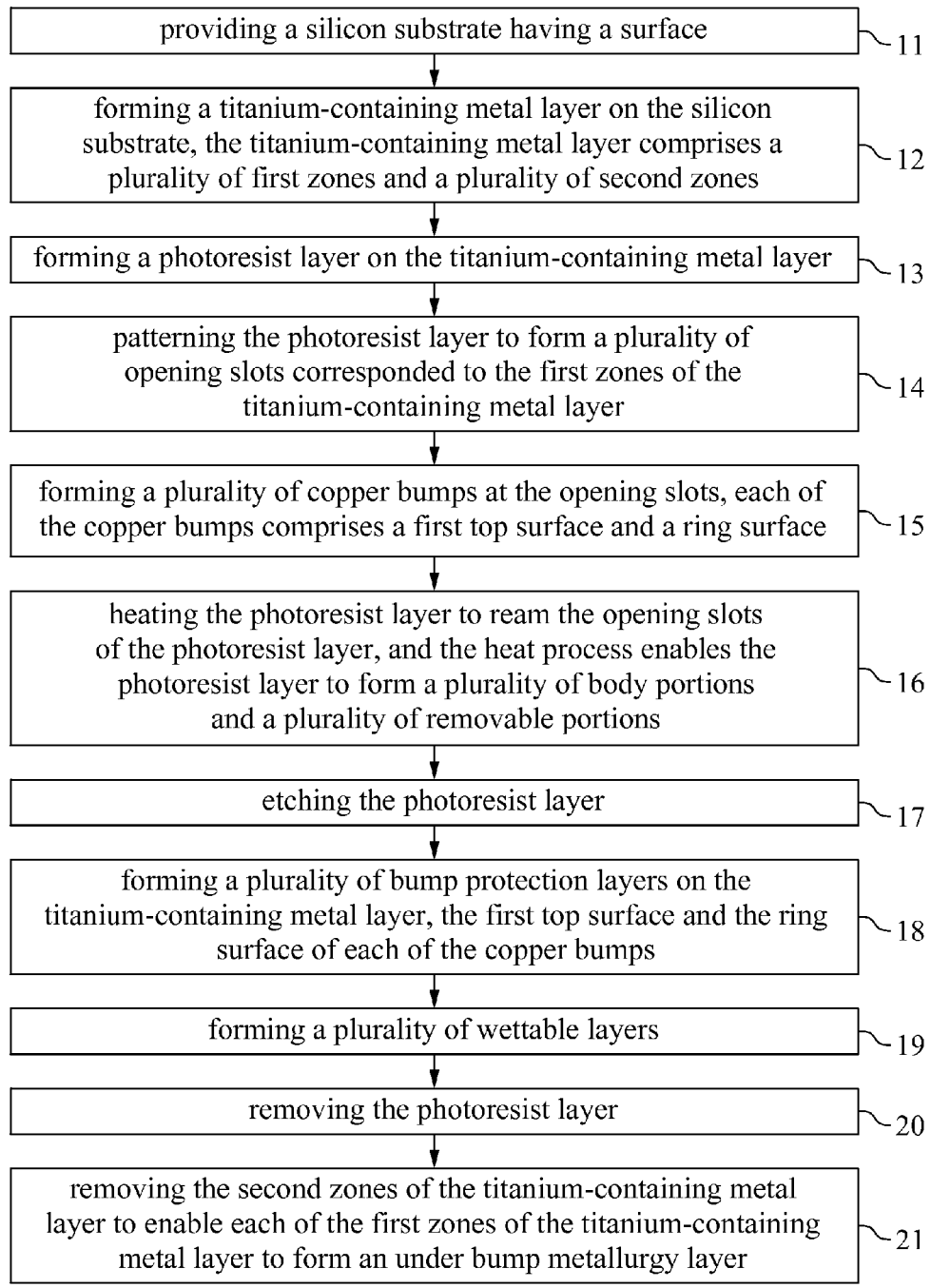
FIG. 1 is a flow illustrating a method for manufacturing fine-pitch bumps in accordance with a preferred embodiment of the present invention.
Figure 2A:
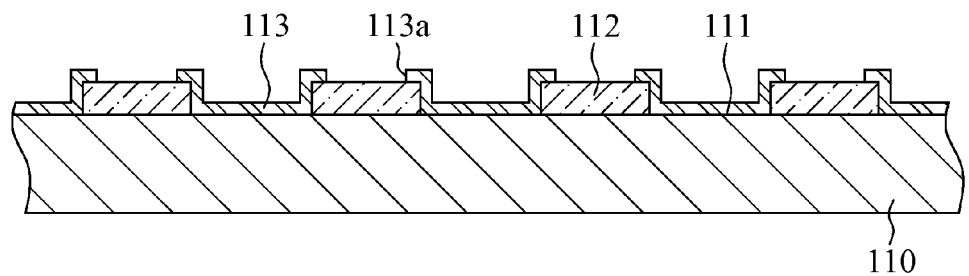
FIGS. 2A to 2K are sectional schematic diagrams illustrating a method for manufacturing fine-pitch bumps in accordance with a preferred embodiment of the present invention.
Figure 2B:
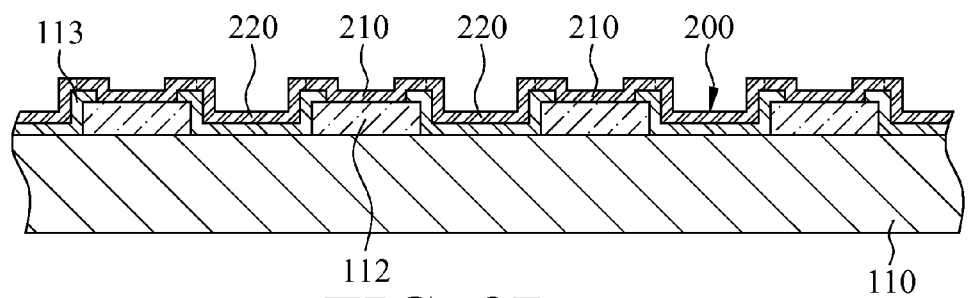
Figure 2C:
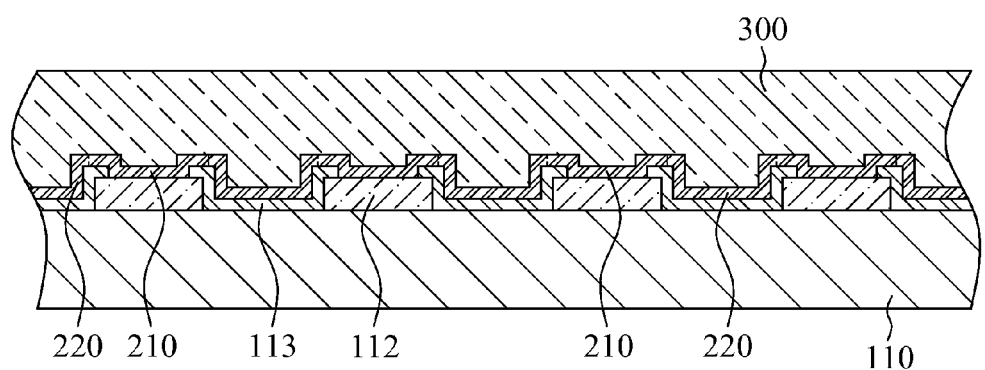
Figure 2D:
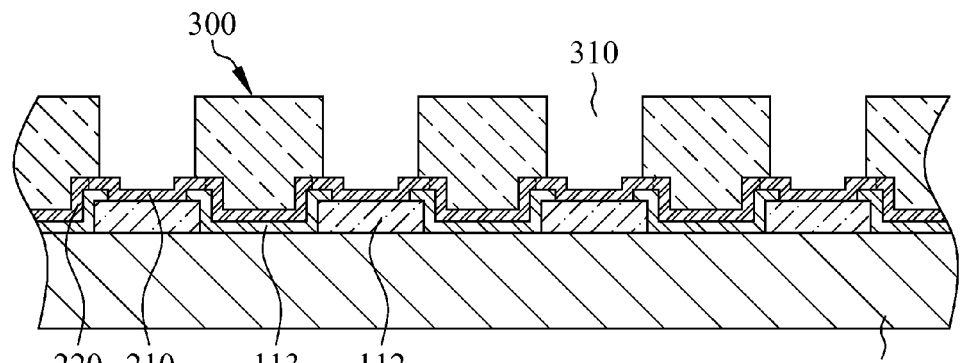
Figure 2E:
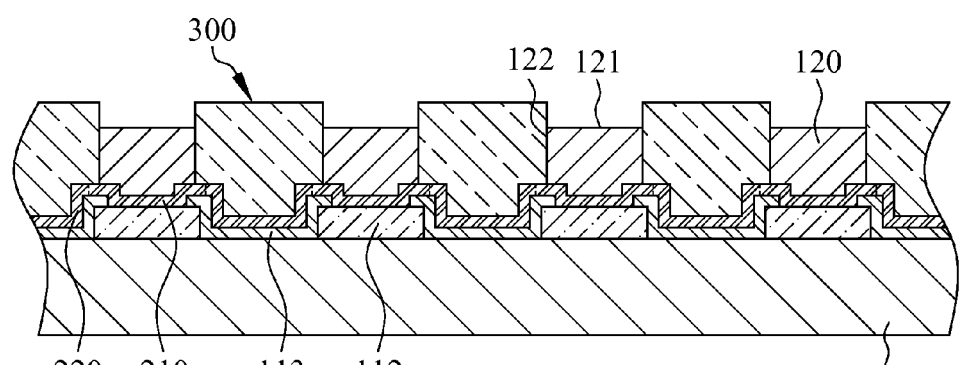

With reference to FIGS. 1 and 2A to 2K, a method for manufacturing fine-pitch bumps in accordance with a preferred embodiment of the present invention comprises the following steps of: first, with reference to step 11 of FIG. 1 and FIG. 2A, providing a silicon substrate 110 having a surface 111, a plurality of bond pads 112 disposed at the surface 111 and a protective layer 113 disposed at the surface 111, wherein the protective layer 113 comprises a plurality of openings 113a, and the bond pads 112 are revealed by the openings 113a; next, referring to step 12 of FIG. 1 and FIG. 2B, forming a titanium-containing metal layer 200 on the silicon substrate 110, the titanium-containing metal layer 200 comprises a plurality of first zones 210 and a plurality of second zones 220 located outside the first zones 210, the protective layer 113 and the bond pads 112 are covered with the titanium-containing metal layer 200; thereafter, referring to step 13 of FIG. 1 and FIG. 2C, forming a photoresist layer 300 on the titanium-containing metal layer 200; afterwards, referring to step 14 of FIG. 1 and FIG. 2D, patterning the photoresist layer 300 to form a plurality of opening slots 310 corresponded to the first zones 210 of the titanium-containing metal layer 200; then, referring to step 15 of FIG. 1 and FIG. 2E, forming a plurality of copper bumps 120 at the opening slots 310, each of the copper bumps 120 comprises a first top surface 121 and a ring surface 122.

Figure 2F:
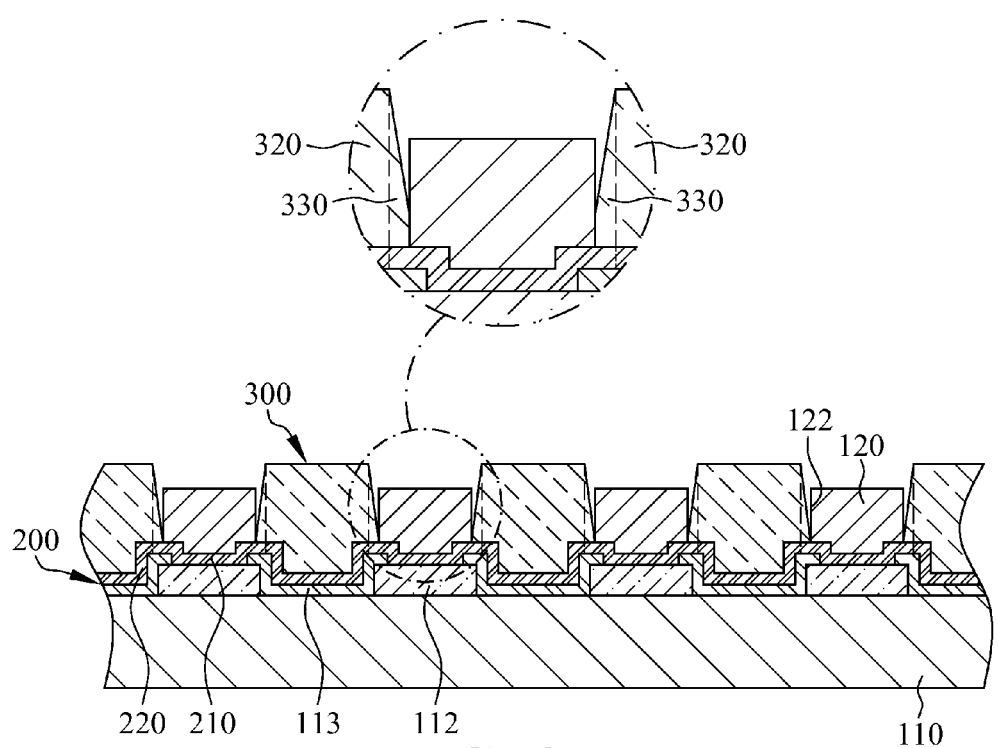
Figure 2G:
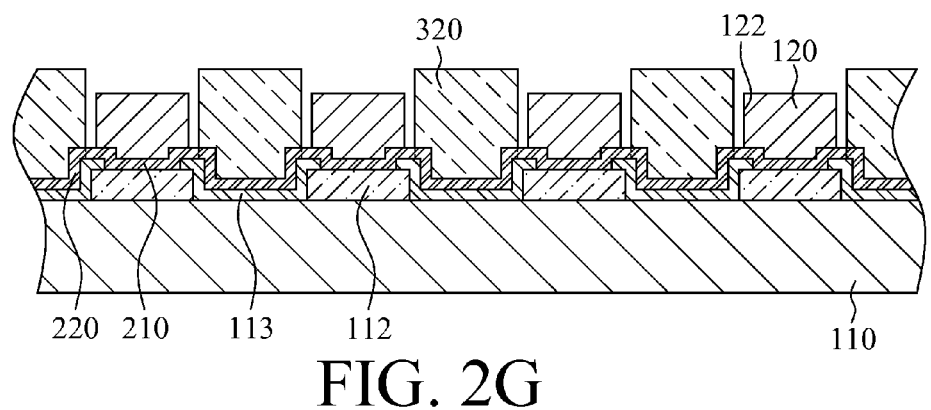
Figure 2H:
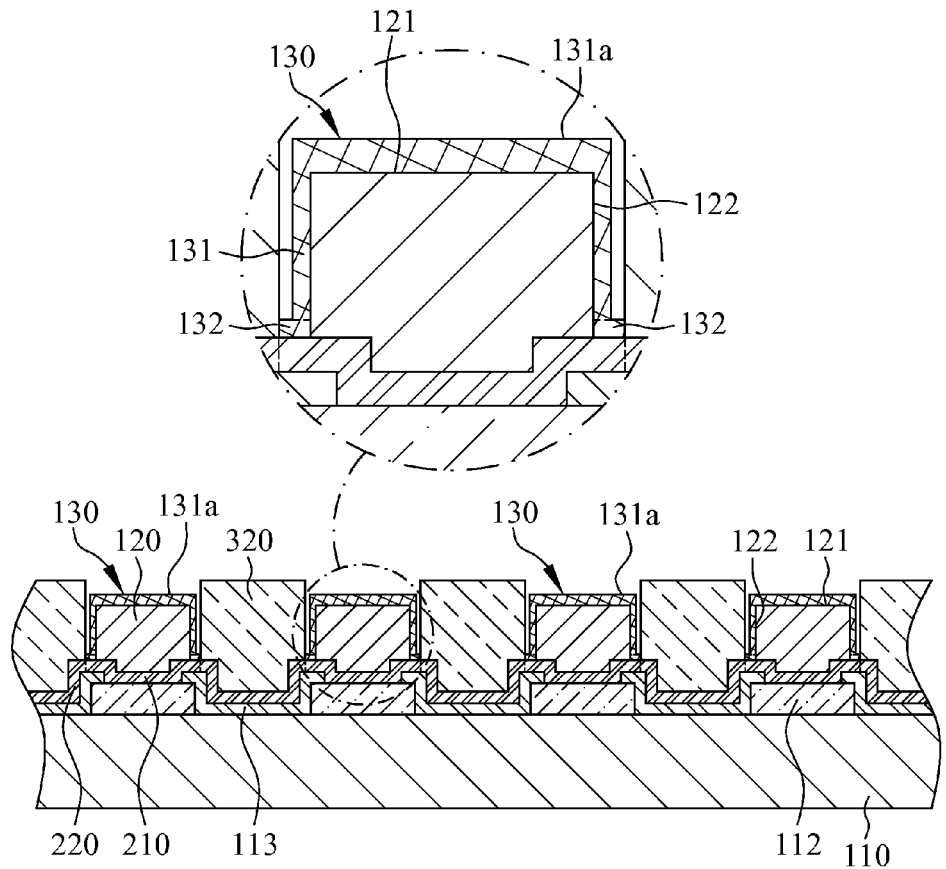

Next, referring to step 16 of FIG. 1 and FIG. 2F, heating the photoresist layer 300 to ream the opening slots 310 of the photoresist layer 300, and the heat process enables the photoresist layer 300 to form a plurality of body portions 320 and a plurality of removable portions 330, in this embodiment, the glass transition temperature in the heat process ranges from 70 to 140 degrees; afterwards, referring to step 17 of FIG. 1 and FIG. 2G, etching the photoresist layer 300 to remove the removable portions 330 and expose the titanium-containing metal layer 200, in this embodiment, the method for etching the photoresist layer 300 can be a method of plasma dry etching; thereafter, with reference to step 18 of FIG. 1 and FIG. 2H, forming a plurality of bump protection layers 130 on the titanium-containing metal layer 200, the first top surface 121 and the ring surface 122 of each of the copper bumps 120, wherein each of the bump protection layers 130 comprises a metallic coverage portion 132 and a bump coverage portion 131 having a second top surface 131a, the first top surface 121 and the ring surface 122 of each of the copper bumps 120 are covered with the bump coverage portion 131, in this embodiment, the material of the bump protection layers 130 can be chosen from one of nickel, palladium or gold.

Figure 2I:
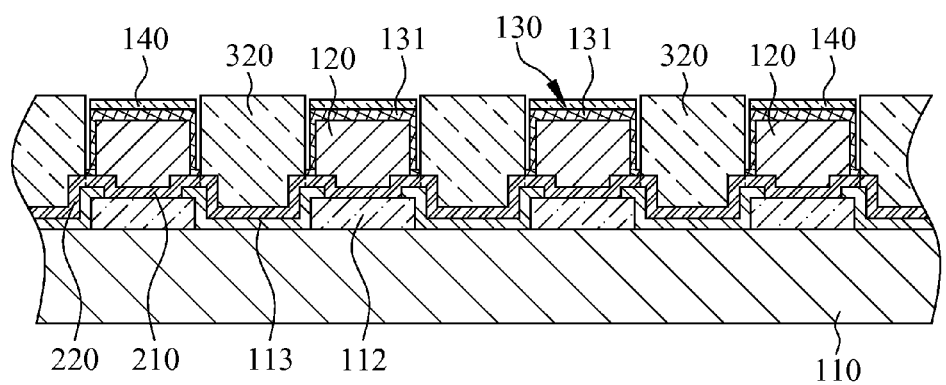
Figure 2J:
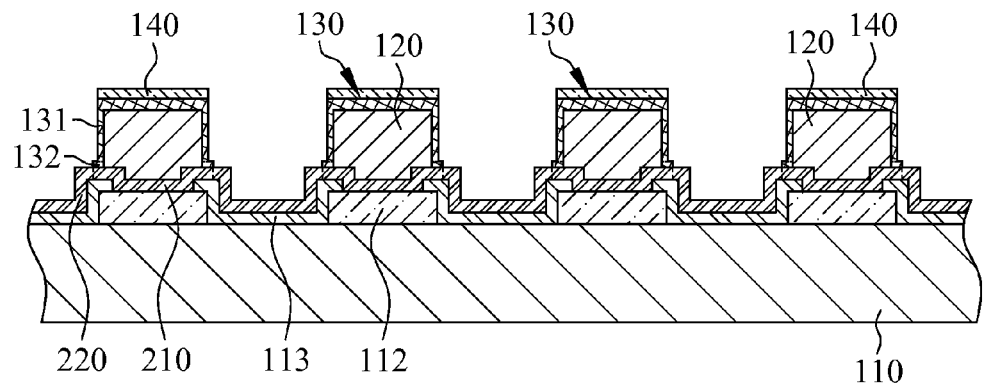
Figure 2K:
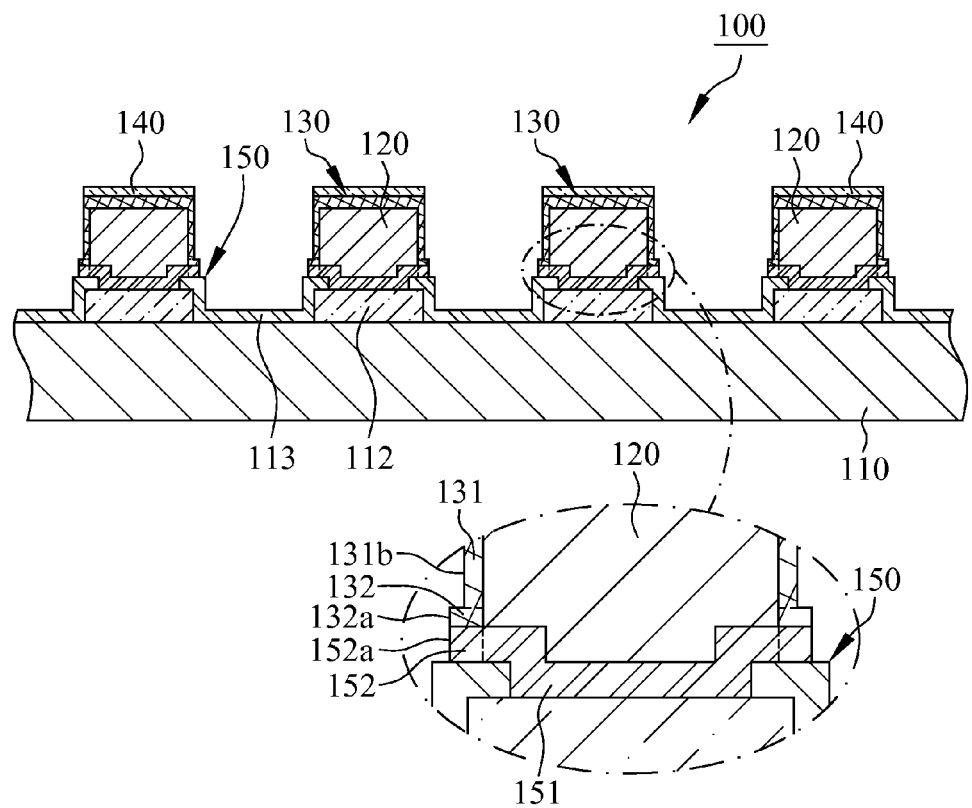

Next, referring to step 19 of FIG. 1 and FIG. 2I, forming a plurality of wettable layers 140 on the second top surfaces 131a of the bump coverage portions 131; afterwards, referring to step 20 of FIG. 1 and FIG. 2J, removing the body portions 320 of the photoresist layer 300 to reveal the wettable layers 140 and the bump protection layers 130; eventually, referring to step 21 of FIG. 1 and FIG. 2K, removing the second zones 220 of the titanium-containing metal layer 200 to enable each of the first zones 210 of the titanium-containing metal layer 200 to form an under bump metallurgy layer 150 located under each of the copper bumps 120 therefore forming a fine-pitch bump structure 100, wherein each of the under bump metallurgy layers 150 comprises a bearing portion 151 located under each of the copper bumps 120 and an extending portion 152 protruded to the ring surface 122 of each of the copper bumps 120, the protective layer 113 is partly covered with the extending portion 152 of the under bump metallurgy layers 150, and the extending portion 152 of each of the under bump metallurgy layers 150 is covered with the metallic coverage portion 132 of each of the bump protection layers 130. The under bump metallurgy layers 150 are made of a material selected from one of titanium/tungsten/gold, titanium/copper and titanium/tungsten/copper. In addition, in this embodiment, each of the bump coverage portions 131 comprises a first outer lateral surface 131b, wherein each of the metallic coverage portions 132 is protruded to the first outer lateral surface 131b of the bump coverage portion 131 and comprises a second outer lateral surface 132a. Furthermore, the extending portion 152 of each of the under bump metallurgy layers 150 comprises a third outer lateral surface 152a coplanar with the second outer lateral surface 132a. The copper bumps 120 being covered by the bump protection layers 130 may lower dissociation of copper ions released from the copper bumps 120, which improves reliability of the fine-pitch bump structure 100 effectively. Besides, the protection of the bump protection layers 130 may prevent the copper bumps 120 from collapsing when removing the second zones 220 of the titanium-containing metal layer 200.

With reference to FIG. 2K again, a fine-pitch bump structure 100 in accordance with a preferred embodiment of the present invention at least comprises a silicon substrate 110, a plurality of under bump metallurgy layers 150, a plurality of copper bumps 120, a plurality of bump protection layers 130, and a plurality of wettable layers 140, wherein the silicon substrate 110 comprises a surface 111, a plurality of bond pads 112 disposed at the surface 111 and a protective layer 113 disposed at the surface 111. The protective layer 113 comprises a plurality of openings 113a, and the bond pads 112 are revealed by the openings 113a. The under bump metallurgy layers 150 are formed on the bond pads 112, each of the under bump metallurgy layers 150 comprises a bearing portion 151 and an extending portion 152, and the under bump metallurgy layers 150 are made of a material selected from one of titanium/tungsten/gold, titanium/copper and titanium/tungsten/copper. The copper bumps 120 are formed on the under bump metallurgy layers 150, and each of the copper bumps 120 comprises a first top surface 121 and a ring surface 122. The bearing portion 151 of each of the under bump metallurgy layers 150 is located under each of the copper bumps 120, and the extending portion 152 of each of the under bump metallurgy layers 150 is protruded to the ring surface 122 of each of the copper bumps 120. The bump protection layers 130 are formed on the extending portions 152 of the under bump metallurgy layers 150, the first top surface 121 and the ring surface 122 of each of the copper bumps 120. Each of the bump protection layers 130 comprises a metallic coverage portion 132 and a bump coverage portion 131 having a second top surface 131a, wherein the first top surface 121 and the ring surface 122 of each of the copper bumps 120 are covered with each of the bump coverage portions 131, and the extending portion 152 of each of the under bump metallurgy layers 150 is covered with each of the metallic coverage portions 132. In this embodiment, the material of the bump protection layers 130 can be chosen from one of nickel, palladium or gold. The wettable layers 140 are formed on the second top surfaces 131a of the bump coverage portions 131. The bump coverage portion 131 further comprises a first outer lateral surface 131b, the metallic coverage portion 132 is protruded to the first outer lateral surface 131b and comprises a second outer lateral surface 132a, and the extending portion 152 of each of the under bump metallurgy layers 150 comprises a third outer lateral surface 152a coplanar with the second outer lateral surface 132a.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A method for manufacturing fine-pitch bumps comprising:
    providing a silicon substrate having a surface, a plurality of bond pads disposed at the surface and a protective layer disposed at the surface, wherein the protective layer comprises a plurality of openings, and the bond pads are revealed by the openings;
    forming a titanium-containing metal layer on the silicon substrate, the titanium-containing metal layer comprises a plurality of first zones and a plurality of second zones located outside the first zones, the protective layer and the bond pads are covered with the titanium-containing metal layer;
    forming a photoresist layer on the titanium-containing metal layer;
    patterning the photoresist layer to form a plurality of opening slots corresponded to the first zones of the titanium-containing metal layer;
    forming a plurality of copper bumps at the opening slots, each of the copper bumps comprises a first top surface and a ring surface;
    heating the photoresist layer to ream the opening slots of the photoresist layer, and the heat process enables the photoresist layer to form a plurality of body portions and a plurality of removable portions;
    etching the photoresist layer to remove the removable portions and expose the titanium-containing metal layer;
    forming a plurality of bump protection layers on the titanium-containing metal layer, the first top surface and the ring surface of each of the copper bumps, wherein each of the bump protection layers comprises a metallic coverage portion and a bump coverage portion having a second top surface, the first top surface and the ring surface of each of the copper bumps are covered with the bump coverage portion;
    forming a plurality of wettable layers on the second top surfaces;
    removing the body portions of the photoresist layer; and
    removing the second zones of the titanium-containing metal layer to enable each of the first zones of the titanium-containing metal layer to form an under bump metallurgy layer located under each of the copper bumps, each of the under bump metallurgy layers comprises a bearing portion located under each of the copper bumps and an extending portion protruded to the ring surface of each of the copper bumps, and the extending portion of each of the under bump metallurgy layers is covered with the metallic coverage portion of each of the bump protection layers.

2. The method for manufacturing fine-pitch bumps in accordance with claim 1, wherein the method for etching the photoresist layer can be a method of plasma dry etching.

3. The method for manufacturing fine-pitch bumps in accordance with claim 1, wherein each of the bump coverage portions comprises a first outer lateral surface, each of the metallic coverage portions is protruded to the first outer lateral surface of the bump coverage portion and comprises a second outer lateral surface.

4. The method for manufacturing fine-pitch bumps in accordance with claim 3, wherein the extending portion of each of the under bump metallurgy layers comprises a third outer lateral surface coplanar with the second outer lateral surface.

5. The method for manufacturing fine-pitch bumps in accordance with claim 1, wherein the glass transition temperature in the heat process ranges from 70 to 140 degrees.

6. The method for manufacturing fine-pitch bumps in accordance with claim 1, wherein the material of the bump protection layers can be chosen from one of nickel, palladium or gold.

7. The method for manufacturing fine-pitch bumps in accordance with claim 1, wherein the under bump metallurgy layers are made of a material selected from one of titanium/tungsten/gold, titanium/copper and titanium/tungsten/copper.

* * * * *